United States Patent
Horzel et al.

(10) Patent No.: US 8,481,419 B2
(45) Date of Patent: Jul. 9, 2013

(54) METHOD FOR PRODUCING A METAL CONTACT ON A COATED SEMICONDUCTOR SUBSTRATE

(75) Inventors: Jorg Horzel, Heverlee (BE); Gunnar Schubert, Constance (DE); Stefan Dauwe, Blankenbach (DE); Peter Roth, Hanau (DE); Tobias Droste, Darmstadt (DE); Wilfried Schmidt, Schwaigern (DE); Ingrid Ernst, Kahl (DE)

(73) Assignee: SHOTT Solar AG, Mainz (DE)

( * ) Notice: Subject to any disclaimer, the term of this patent is extended or adjusted under 35 U.S.C. 154(b) by 282 days.

(21) Appl. No.: 13/125,815

(22) PCT Filed: Nov. 26, 2009

(86) PCT No.: PCT/EP2009/065868
§ 371 (c)(1),
(2), (4) Date: Apr. 25, 2011

(87) PCT Pub. No.: WO2010/060944
PCT Pub. Date: Jun. 3, 2010

(65) Prior Publication Data
US 2011/0201196 A1    Aug. 18, 2011

(30) Foreign Application Priority Data
Nov. 28, 2008    (DE) .................... 10 2008 037 613

(51) Int. Cl.
*H01L 21/4763* (2006.01)
(52) U.S. Cl.
USPC ............ 438/614; 438/89; 438/98; 438/537; 257/E21.28; 257/E21.275; 136/255; 136/256; 136/261

(58) Field of Classification Search
USPC ............... 438/89, 98.537, 614; 257/447, 461, 257/734, 758, E21.28, E21.275; 136/255, 136/256, 261
See application file for complete search history.

(56) References Cited

U.S. PATENT DOCUMENTS

| 4,612,698 A * | 9/1986 | Gonsiorawski et al. ........ 438/72 |
| 4,703,553 A * | 11/1987 | Mardesich ..................... 438/89 |
| 2002/0153039 A1 | 10/2002 | Moon et al. |
| 2007/0166520 A1 * | 7/2007 | Leib et al. .................... 428/209 |
| 2008/0035489 A1 | 2/2008 | Allardyce et al. |

FOREIGN PATENT DOCUMENTS
JP    58 100465    6/1983

OTHER PUBLICATIONS

Ballif et al, "Silver Thick-Film Contacts on Highly Doped n-Type Silicon Emitters: Structural and Electronic Properties of the Interface" American Institute of Physics, Mar. 2003, pp. 1878-1880.
Shubert, "Thick Film Metallisation of Crystalline Silicon Solar Cells, Mechanisms, Models and Applications" Jun. 2007, pp. 1-142.

* cited by examiner

*Primary Examiner* — Charles Garber
*Assistant Examiner* — Abdulfattah Mustapha
(74) *Attorney, Agent, or Firm* — Ladas & Parry, LLP

(57) ABSTRACT

A method for producing an electrically conducting metal contact on a semiconductor component having a coating on the surface of a semiconductor substrate. In order to keep transfer resistances low while maintaining good mechanical strength, the invention proposes applying a particle-containing fluid onto the coating, where the particles contain at least metal particles and glass frits, curing the fluid while simultaneously forming metal areas in the substrate through heat treatment, removing the cured fluid and the areas of the coating covered by the fluid, and depositing, for the purposes of forming the contact without using intermediate layers, electrically conducting material from a solution onto areas of the semiconductor component in which the coating is removed while at the same time conductively connecting the metal areas present in said areas on the substrate.

18 Claims, 3 Drawing Sheets

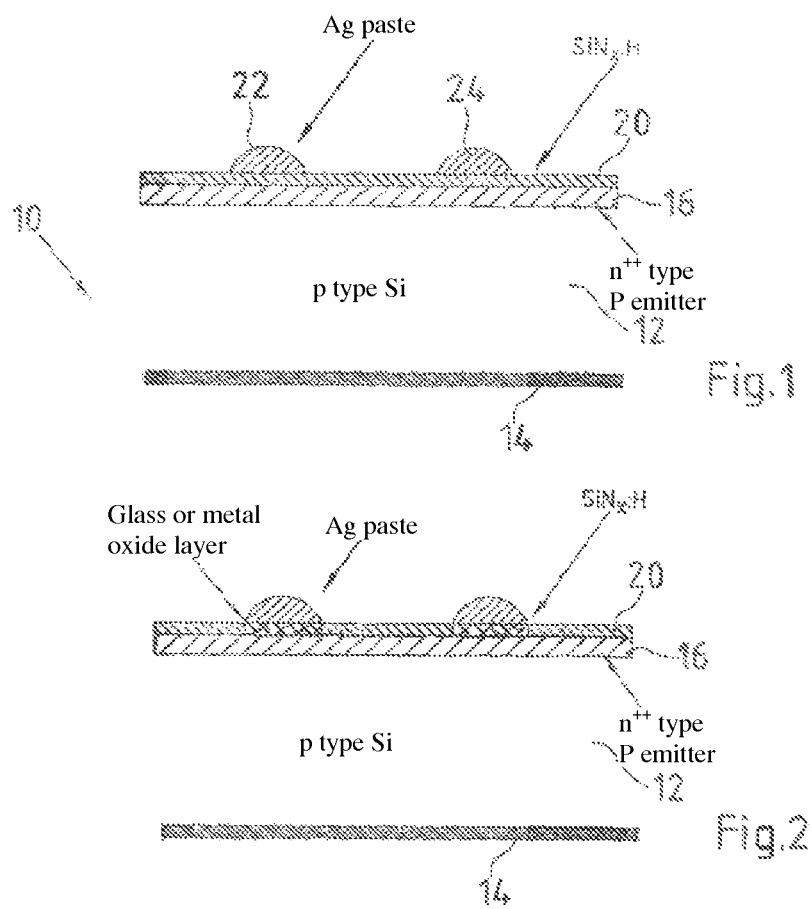

METHOD FOR PRODUCING A METAL CONTACT ON A COATED SEMICONDUCTOR SUBSTRATE

Figure 3:
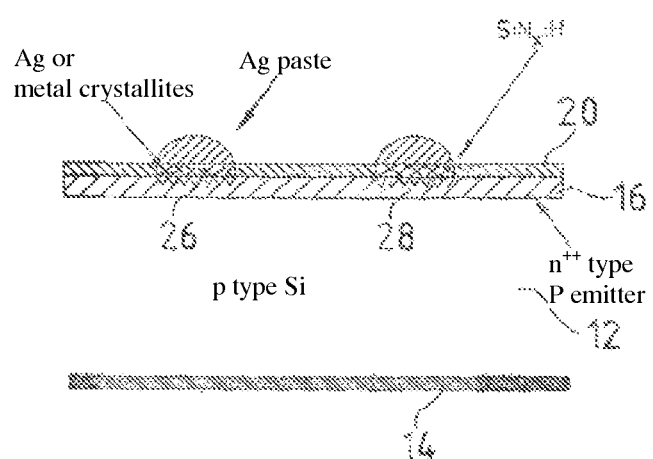

The invention relates to a method for producing an electrically conducting metal contact, strip-shaped in particular, with a semiconductor component, such as, a solar cell, which presents on the surface on a substrate, a coating, such as, a dielectric coating, such as, a passivation coating, made, for example, of silicon nitride, silicon oxide, titanium oxide.

More than 90% of the currently commercially available solar cells and solar modules use crystalline silicon as solar cell material. The predominant part of these solar cells is based on methods in which, first, the surface near region of a plate- or disk-shaped substrate, as starting wafer, which in principle presents a homogeneous initial doping, is doped with the opposite polarity as the base material (substrate) via a diffusion process. Usually, p-doped Si starting wafers are n-doped by phosphorus diffusion on at least one surface—usually the light receiving side—or a part of the surface. However, n-doped crystalline Si starting material is also used as solar cell material, and p-doped by diffusion processes (for example, with boron) or alloying processes (aluminum), on at least one of the surfaces or a part of the surface.

The predominant part of the industrially manufactured silicon solar cells is based on metal paste contacts, which collect the current on both sides of the semiconductor transition, and convey it to collective contacts —so-called busbars or soldering pads—, which make it possible to solder on solder connectors, and electrically connect solar cells to each other in a solar module. The metal pastes used for establishing contacts for the solar cells make it possible, for example, to contact silicon surfaces through dielectric coatings, such as, SiNx:H, SiO2, TiOx or others. To date, the Ag pastes that have been used predominantly present a small weight portion of glass frits or in part other inorganic additives, which are sintered at comparatively high temperatures (700-900° C.). During the typically relatively short sintering process, after burning out organic components, such as, solvents and binders, the sintering process typically passes through the maximum temperature only very briefly ('peak firing'; 'sintering spike'). During the sintering process, the glass frit, which contains metal oxides, and which is contained in the Ag paste is at first soft, then liquid, and it wets the surface of the solar cell. The glass frits and other inorganic additives are frequently chosen in such a manner that they etch through dielectric coatings that may be present on the wafer surface. The metal oxides contained in the glass melt interact with the silicon surface in a redox reaction. In the process, SiOx form, and reduced metal ions, which are dissolved in the melt. Thus, the glass melt etches partially into the silicon surface, and Ag is detached from the molten glass and the metal ions contained therein. During the cooling process, Ag is deposited epitaxially on the silicon surface preferably at <111>surfaces. In the original silicon surface, Ag crystallites form, which, after the cooling process, are spatially and largely electrically separated from each other by the glass intermediate coating which has again solidified. Above this glass layer, after the sintering, a conductive structure of Ag particles that are sintered together is located. The conductivity of the contact so established between silicon and Ag is limited by the glass layer with limited conductivity, between the Ag crystallites deposited in the silicon surface, and the Ag particle structure that is sintered together. This conductivity is determined by the thickness of the glass layer and the metal precipitates dissolved therein, which increase the tunneling probability for charge carriers. Contacts to silicon can also be produced using other metal pastes.

Elements, such as, Ag, Ni, Pd, Zn, Ti, Pb, Sn, Sb, Bi, Al, B and others have already been used for years in pastes, usually as components in oxidic form, or within a glass matrix, to establish contact to silicon. However, if the contact is to be made through a dielectric coating—usually an advantageous passivation coating on the silicon surface—, preference should be given to Ag pastes that contain glass frits and are fired at higher process temperatures (>glass melting point), because this is a relatively simple process which at the same time has an achievable high throughput and is industrially cost effective.

The density and size—laterally or penetration depth—of the Ag crystallites formed in silicon, and the thickness of the glass layer here are strongly dependent on the heat treatment or the glass frits used—type, quantity, particle size distribution—and other inorganic additives used, as well as the oven atmosphere during sintering/firing of paste. A complicating factor here is that the optimal crystal density, and the most conductive, that is, the thinnest, glass layer, cannot be achieved necessarily with the same heat treatment, so that an appropriate temperature profile often represents a compromise between two requirements, and, moreover, it must be achieved reproducibly to achieve optimal results. Consequently, the processing window is quite small.

The Ag pastes and other metal pastes developed to date as well as the associated application, sintering and contacting methods, which are suitable for contacting industrial crystalline Si solar cells and used in large quantity, present a number of disadvantages. These disadvantages include:

Higher contact transition resistance of the paste contacts to silicon, particularly in case of silicon surfaces with low doping ($<<10^{20}$ dopant atoms/cm$^3$).

Relatively low conductivity of the paste contacts due to porous contact surface, and glass portions in the contact surface. The conductivity is clearly lowered in comparison to pure metal coatings.

A relatively high proportion of starting metals, such as, Ag, is necessary to achieve a sufficiently high conductivity of the contacts. Thus, the consequences are increased consumable material costs and unnecessary shading losses.

Limitation of the minimally achievable contact line width, due to particle sizes in the pastes, and the required cross-sectional conductivity of the contact lines in the interaction with paste application methods, such as, screen printing, particularly if the goal is to achieve small contact lines with high application thickness, to reduce light shading on the solar cell front side and/or to contact emitters with low cross-sectional conductivity.

Limited adhesive strength on the solar cell surface, and limited long-term resistance of the contacts. The metal structure or the glass layers of the contacts interact during cooling processes—after the sintering or soldering—in case of soldering, and long-term interaction with substances produced in the module composite. Thermal and mechanical influencing factors, such as, for example, different expansion coefficients of the material composite, as well as possible chemical interactions, play a role here. The mentioned influences can have a long-term negative influence on the performance of the solar cell and its contacts during the course of the product's lifespan, that is, on the solar module in the given application environment. This results in necessary compromises, which take into consideration the interaction with all the materials and substances that may be used in the manufacture and operation of the solar modules, in order to ensure the required lifespan, and the maximum energy conversion efficiency achievable at the level of the solar cell, at least temporarily.

Ag pastes that have been available commercially to date are not suitable to contact phosphorus emitters with low surface dopant concentration in such a way that small contact transition resistances can be achieved, while simultaneously high fill factors in solar cells can be obtained. The consequences are recombination losses in the highly doped emitters ($>10^{20}$ P atoms/cm$^3$) of the industrially used crystalline Si solar cells, which can be contacted with Ag pastes. As a result, the short circuit current and energy conversion efficiency of the solar cell are limited.

Use of heavy metal containing glass frits, such as, $PbO_x$, $CdO_x$, and thus components that are harmful to health and environment, in the Ag pastes which, in the module composite, may no longer satisfy future guidelines of the European electronics industry.

The contact structure of printed metal contacts on Si solar cells is porous, and is therefore not suitable without limitation for a secondary treatment in current-free or galvanic aqueous solutions for the deposition (plating) of metals out of the solution, because residues of the solutions used for the deposition of metals can remain or be enclosed in the porous structure, and can lead later in the module composite to damage to the contacts and thus the solar modules. The resulting disadvantages include loss of energy conversion efficiency, delamination of the modules, discoloration of the contacts and solar cells.

From U.S. Pat. No. 4,703,553, an extrusion method for the manufacture of a solar cell is known. To form rear side contacts, an aluminum containing paste is applied on the oxide coating extending over the rear side. By a subsequent heat treatment, the Al particles should oxidize on its surface, which should remove the underlying oxide coating in some areas. Any remaining aluminum particles form an alloy with the substrate material of the solar cell. By means of an HCl solution, remainders of the aluminum and aluminum oxide that remain on the substrate are then removed. Beneath the areas so uncovered, a highly doped p$^+$ area is thus located.

The object of US-A-2002/0153039 is the manufacture of a solar cell on whose outer sides oxide coatings are applied. $P_2O_5$ material is printed on the front side, and $B_2O_3$ material on the back, to form a coating of phosphorus silicate glass or borosilicate glass. Subsequently, highly doped n$^{++}$ or p$^{++}$ coatings then form by thermal processes in the front or rear side area. The phosphosilicate (PSG) or borosilicate glass layer (BSG) is then etched off using hydrofluoric acid. As a result, the adjacent areas of the oxide coatings are also partially attacked. Subsequently, an application of electrically conductive contacts occurs. Parts of the adjacent oxide coatings should still remain after complete removal of the PSG and BSG coatings.

The present invention is based on the problem of further developing a method for producing an electrically conductive metal contact on the surface of semiconductor component, such as, a solar cell, in such a way that, if the mechanical resistance is good, low transition resistances occur. The surface extent of the metal contact should also be minimized, in order to keep, with solar cells as semiconductor components, the shading as low as possible. Furthermore, a reliable contacting in surface areas should be possible.

To solve the problem, the invention proposes a method for producing at least one electrically conducting metal contact, strip-shaped in particular, on a semiconductor component, such as, a solar cell, which presents, on the surface side on a semiconductor substrate, a coating, such as, a dielectric coating, for example, a passivation coating, which comprises the following process steps, line-, strip- and/or point-shaped application of a fluid to the coating, which contains at least particles made of metal, and particles made of glass frit, hardening of the fluid by heat treatment with simultaneous formation of:

cohesive metal structure for sintering the metal particles together, a glass layer between the metal structure and the semiconductor substrate, and metal areas in the semiconductor substrate, which are separated by the glass layer from the metal structure on the semiconductor substrate, removal of the separating glass layer by etching, and thus simultaneous removal of the metal structure, without removal of the metal areas which have grown into the semiconductor substrate, for the formation of the at least one electrically conductive contact, intermediate coating-free deposition of electrically conducting material from a solution onto the metal areas of the semiconductor component, which have grown into the semiconductor component, where, above the metal areas, the glass layer and metal structure coating have been removed, with simultaneous electrically conducting connection of the metal areas present in these areas in the substrate.

Here, it is assumed that, during the heat treatment, the metal areas form by redox reduction of the metal oxide-containing glass melt with the semiconductor material, such as, Si material, and slight etching of the semiconductor material and subsequent epitactic deposition.

In particular, it is provided that the fluid used contains additionally metal oxide.

As fluid, one can consider particularly a paste, but also an ink or an aerosol, whose composition must ensure etching through the coating, such as, the passivation coating.

However, the fluid is preferably a paste with a low weight proportion of glass frit or partially other inorganic additives, as known from the state of the art, which can etch through the coating, such as, the dielectric coating, such as, the passivation coating. Organic components, such as, solvents and binders, can also be present in the paste.

Below, the coating, if any, present on the semiconductor substrate is referred to in general as dielectric coating, although this does not constitute a limitation of the teaching according to the invention.

The single-step metalizing contact used to date for contacting semiconductor components by paste application methods, with subsequent drying and sintering of the applied metal paste, is replaced by a multistep method, in which—in accordance with the state of the art —first a fluid, such as, the metal paste, is applied in lines or strips or points, dried, and sintered. However, subsequently, the applied contact structure is removed to such an extent that the glass layer or metal oxide coating on which the metal contact surface is located is largely detached, leaving only the metal crystallite areas on the semiconductor component surface, which directly form the ohmic contact to the semiconductor, that is, the substrate, and thus make tunneling mechanisms for the contact transition resistance superfluous. After the detachment of the porous metal structure and glass layers, an ohmic connection to the metal coatings to be applied to the crystallites is thus formed, at places where the contact lines or points were fired beforehand, via the crystallites (for example, epitaxially deposited Ag crystallite areas).

It is ensured that the etching effect that occurs during the heat treatment, such as, melting, due to the fluid, particularly the metal paste, locally opens the dielectric coating present on the substrate surface, so that, through it, the desired electrically conductive contact for the subsequent metal coatings is ensured, with low transition resistance. In particular, galvanic or current-free metal coatings, such as, Ag, Ni, Cu, Pd, Ti, Sn, Al can be deposited. Here, these coatings are deposited in the desired order and/or thickness, generally one after the other or one above the other.

Instead of producing, according to the state of the art, an electrical contact to the semiconductor material, such as silicon, with metal pastes, substantially by applying the paste and subsequent heat treatment or sintering, a multistep method is used according to the invention.

In a first step, in a similar or adapted method according to the state of the art, a fluid, such as a metal-containing paste, is applied on the desired areas of the semiconductor component, such as, a solar cell surface, and, in subsequent drying and sintering methods, it etches through the dielectric coating, such as, the passivation coating, and metal areas, such as metal crystallites, in the silicon, grow epitaxially in the semiconductor, such as, silicon, during cooling after the maximum sintering temperature.

During the cooling process, metal which is dissolved in the glass is deposited, for example, Ag, if an Ag paste is used. The deposition occurs preferably at places where the semiconductor surface, such as, Si surface, was slightly etched by redox reaction. There, epitactic growth of metal, such as, Ag, crystals or crystallites, occurs.

In comparison to the state of the art, other fluid compositions, such as, paste compositions, other line widths and application heights for the pastes as well as other sintering conditions can be considered, because the so produced contact is only an intermediate step before the definitive contact, and can thus be optimized differently. According to the invention, a point-shaped application of the fluid can also occur, particularly in rows of points, for the later establishment of the electrically conducting connection.

The heat treatment or sintering occurs at a temperature $T_{sint} > T_{melt}$ with $T_{melt}$=melting temperature of the glass frit, preferably with 700° C.$<T_{sint}<$1000° C.

In the second step, the contact so produced is first removed partially in an additional etching step. In the process, for example, in hydrofluoric acid or other oxide reducing solutions, the glass layer, which in the case of sintered Ag paste contacts separates the crystallites and Ag particle structures from each other, is removed so that only the Ag crystallites which grow epitaxially into the semiconductor surface, such as, Si surface, remain in contact with the semiconductor, such as, silicon, while the remaining fluid, such as paste, structure is removed.

Regarding the metal or Ag particle structure, the following should be noted. Metal particles sinter together under the influence of heat and melting of the glass frit. In the process, the glass frit, including among others also metals on the surface of the metal particle, is reduced. After cooling, a cohesive metal structure forms which, however, presents a lower density and conductivity than a dense metal coating.

In an additional process step, in the third step, a metal coating is directly deposited or applied on the remaining structures of cohesive or closely adjacent Ag crystallites, with higher conductivity and lower contact transition resistance than is the case at first with sintered metal contacts. Due to the metal coating, the Ag crystallites are connected conductively to each other. Here, one can consider using any methods which, without considerable financial or process technology associated additional expenses, allow the production of contacts with improved conductivity and/or long-term resistance in the module composite, and a metallic contact, between the metal areas that have grown in the semiconductor material (first step of the method), and the metal coatings that have now been plated on them. Suitable methods are, for example, methods that deposit selectively metal out of chemical solutions on the metal areas that have grown into the semiconductor (for example, Ag crystallites) in the case of the usual Ag pastes, by means of which, under identical conditions, no metal can be deposited on semiconductor, such as, Si surfaces or dielectric coatings. Such methods can be, for example, current-free or galvanic metal plating methods, in which, from aqueous solutions, metal is plated selectively on the metal areas that have grown in the semiconductor, because there selectively advantageous electrical potentials with respect to the remaining areas of the solar cell surfaces exist. Because the typical growth of metal coatings during deposition out of chemical solutions occurs predominantly isotropically, closely adjacent crystallite metal area islets grow together during the deposition process, so that the overall result is a cohesive conductive contact structure in the desired areas. The contact transition resistance is considerably lower than in the originally produced metal fluid, such as, paste, contact, because no tunneling mechanism within the separating glass layer is needed any longer; rather, on the one hand, the Ag crystallites are directly in a good electrically conductive contact with the semiconductor, such as, silicon, and, on the other hand, directly in metallic contact with the conductive coating of the contact lines. The line conductivity of the contact can be improved considerably, with identical or smaller cross section of the contacts, because the structure is no longer a porous contact surface with glass proportions; rather, a solid, dense metallic coating with high conductivity can be deposited.

In particular, it is provided that the conductive material is applied with a width B with B<100 μm, particularly B<60 μm, advantageously B<40 μm, particularly preferably B<20 μm and/or the conductive material is applied with an application height of H<15 μm, particularly H<10 μm, preferably H<5 μm, particularly preferably H<1 μm.

In deviation from the state of the art, a direct contact exists between the semiconductor substrate and the electrically conductive material coating, applied galvanically or current-free from a solution in particular, and forming the metal contact(s), which results in a considerably lower transition resistance, in comparison to the state of the art.

The insulating coating present according to the state of the art, between the semiconductor substrate and the metal contact-forming electrically conducting coating, is omitted. In the case of silver, which forms the crystallites in the semiconductor substrate, the state of the art requires in general a glass matrix with insulating effect.

According to the dissertation of G. Schubert, University of Konstanz (2006), "Thick Film Metallization of Crystalline Silicon Solar Cells Mechanisms, Models, Applications," an organic matrix is used, which also has an insulating effect, so that an undesired transition resistance is obtained. For the rest, Schubert's subject is not the manufacture of solar cells with metal contacts. Rather, Schubert examines to what extent an electrically conducting connection can be established between the Ag crystallites forming in the substrate and conductive silver applied to the crystallites. The use of conductive silver to connect the individual crystallite areas is, however, not suitable for solar cell connections, because conducting silver, due to its price, cannot be used economically, and, moreover, it does not wet the Ag crystallite area selectively, and it does not lead to contacts which can be contacted after the soldering processes used in photovoltaics, in order to permanently connect solar cells to each other in an electrically conducting manner, in the modular assembly. Moreover, Schubert applied conductive silver with a width which leads to shading, which would lead to a considerable reduction of the energy conversion efficiency for solar cells.

Ag, or in general the metal part, in the fluids, such as, pastes, as well as, overall, the quantity of metals applied, can be reduced in the multiple step form of metal contact establishment, because, during the first application of the metal fluid, such as, paste contact, a clearly smaller contact cross section is sufficient. This contact must only produce suitable crystallite regions in the silicon, and does not need to achieve a particularly conductive cross section in the metal structure above the glass layer, so that, on the one hand, in the case of a metal paste, the weight proportion which is applied can be reduced considerably, and, on the other hand, its composition can be optimized exclusively with a view to the formation of the metal area in the semiconductor component and the desired ideal sintering process. Here, it is entirely admissible if, for example, the glass proportion is clearly increased in relation to the metal proportion in the paste, although this may have the consequence that the separating glass layer is not especially conductive. To the extent that a high surface density is generated here on metal areas in the semiconductor component after the contact firing, this must be considered advantageous, because as a result the separating glass layer can also be removed more easily in the second partial process step, and the higher glass proportion can form a higher surface density on metal areas in the semiconductor material. In case of deposition of the metal coating after the detachment of the glass layer (etching process), a thick metal coating with higher conductivity is deposited, so that the required metal proportion overall can be smaller than has been the case to date in the usual metal paste contacts. This fact shows the economic practicality of the additional process steps, besides process advantages and improved solar cell energy conversion efficiencies.

Because only a small application height is necessary during the application of the metal paste, additional methods can be considered for the application of the metal pastes, methods that so far could not be used economically or advantageously in the industrial manufacture of solar cells. They include, for example, pad printing or offset printing, ink jet methods, aerosol jet methods, and other known methods. Because the application height during the application of the pastes is no longer decisive for the later conductivity of the pastes, considerably smaller contacts can also be applied, including by screen printing with the use of modified screens and/or pastes. Even small interruptions in the printing image, even at individual points in a row, are acceptable here, provided that, at the time of the subsequent buildup of a conductive coating, they can be closed again, after etching off the glass layer and the metal particle structure. In galvanic or current-free deposition of metals from solutions, this occurs, for example, by the lateral growth of the deposited coating, and a growing together of the individual metal crystallite regions.

For the manufacture of the conductive coatings, which connect the crystallite regions and contact them directly, a number of available methods can be considered, besides the deposition of metals from chemical solutions. Metal pastes also exist which, at comparatively low temperatures, produce conductive coatings and a good mechanical adhesion, without being able to etch through dielectric coatings, or contact silicon directly. It is sufficient here to use a small ohmic contact transition resistance with respect to the metal crystallite regions that have already grown into the semiconductor component. Soldering methods, such as, thermal or ultrasonic methods, and other connection methods for contacting metal areas can also be considered. The material selection is here not limited to the metals that are usually used in the solar sector. Depending on the method, material composites can also be considered.

The use of these additional degrees of freedom leads to lower contact transition resistances, improved line conductivity values of the metal contact lines, less light shading of the solar cells, and better soldering properties of the contacts. The solar cells present a better energy conversion efficiency and fill factor, a better durability in the module composite, improved recombination on metal surfaces, and possibly also lower manufacturing costs.

Moreover, one of the greatest obstacles for currently industrially manufactured crystalline Si cells with metal paste contacts can be eliminated. At this time, the contacting of weakly doped emitter areas (phosphorus surface concentrations in $Si<<10^{20}$ P atoms/cm$^3$) is not possible advantageously. In the attempt to contact silicon surfaces with low doping, it is necessary to use higher process temperatures, more aggressive glass frits in the metal pastes, higher weight proportions of glass frits in the paste composition, or longer process times. This has the consequence that the glass layer between metal structure, and crystallite areas forming in the silicon, is stronger than is possible with conventional contacts. However, this leads to a strong increase in the contact transition resistance, and has a limiting effect for the fill factor of the solar cell. However, if the glass layer can be removed completely after the sintering process, and the contact can be obtained directly on the metal areas that have grown in, then a lower contact transition resistance can be achieved, provided the fluid, such as, the paste, is optimized to produce sufficient crystallite islets at small separation, without introducing contaminants into the semiconductor transition. Also, for this purpose, the emitter area may have to be adapted in a special way. According to the invention, it is also possible to appropriately contact weakly doped emitter surfaces that lend them themselves well for passivation, and achieve high fill factor values with such solar cells. Together with reduced shading losses, the greatest differences between industrial solar cells and high-efficiency laboratory solar cells can thus be overcome. Consequently, with cells that are manufactured industrially using the method described here, clearly higher energy conversion efficiencies can be expected.

According to the invention, a metal contact can be applied to solar cells, which presents, in the case of a p-conductive substrate of the emitters (n-conductive), a concentration c of dopant atoms, such as, phosphorus, with $c<10^{20}$ atoms/cm$^3$, particularly $c<5\cdot10^{19}$ atoms/cm$^3$, particularly $c\approx10^{19}$ atoms/cm$^3$.

The method according to the invention is characterized in that the contact with the silicon occurs primarily at a boundary surface of metal crystallites that have grown epitaxially in the silicon, and the crystallite areas are connected to each other by a highly conductive coating to form cohesive contact structures, which are coupled to the collective bars or collection pads (bar/busbars or soldering islets/pads) of the solar cells.

Although the method according to the invention was explained primarily with Ag-containing fluids, such as, pastes, this does not constitute a limitation of the teaching according to the invention. Rather, one can use fluids, such as, pastes, inks, aerosols, which contain, as metal particles, instead of or in addition to Ag, for example, Ni, Cu, Pd, Ti, Sn, Al, combinations thereof or alloys thereof.

In particular, in the method according to the invention, pastes are used which also contain, besides metal and/or metal atoms and/or glass frits, also oxides of at least one element of the group Pb, Cd, Zn, Bi, Sn, Sb, Al, P, B, Ti, Pd, Tl, Zr, Li, Ga, Ni or Si.

The method according to the invention is used preferably for solar cells whose contact-side passivation coating consists of or contains: $SiO_x$, $SiN_x$: H, $TiO_x$, $Al_2O_3$, $SiNO_x$, SiC or other passivation coatings that are usually used in the semiconductor component sector.

The fluid is applied particularly by printing methods, such as, screen printing, offset printing, pad printing, transfer printing or dispensing methods, ink jet methods, aerosol jet methods, powder coating methods, as known from the copying technology, or other selective coating methods.

In the first process step, it is also possible to apply fluids to the surface of the semiconductor component, which comprise Ag-containing, Ni-containing, Pd-containing, Ti-containing or other metal-containing powders or metal compounds in the form of particles, for example, of alloys or mixtures that contain metal oxides.

The metal deposition on the metal coatings or areas which have grown in the semiconductor, and which have been uncovered, particularly by etching or reduction of oxide coatings, can occur out of solutions that contain Ag, Ni, Cu, Pd, Ti, Al and/or Sn.

In the case of galvanic metal deposition methods for the formation of the contacts, in which individual metal areas that have grown into the semiconductor during contact firing are connected, a light induced influencing of the galvanic potential can be advantageous. In this way, it is possible, for example, to control, via the electrical voltage that is generated in the semiconductor component, such as, the solar cell, and the corresponding photocurrent, with an appropriate illumination intensity, the deposition rate and the deposition selectivity (to influence the deposition rate at contacts with n-regions in comparison to those on p-regions). However, the electrically conductive connections to the metal areas can also occur via soldering methods, such as, ultrasonic soldering methods or heat soldering. Methods, such as, flame spraying of metals, are possible, provided that they serve to selectively connect the desired areas to each other electrically, and a direct ohmic contact is produced between the metal areas that have grown in the semiconductor, and the plated metal coatings.

Additional details, advantages and characteristics of the invention can be obtained, not only from the claims, and the characteristics that can be obtained from them—separately and/or in combination—, but also using the preferred embodiment example which can be taken from the drawings below.

The figures show:

FIGS. 1-5 a method for producing a metal contact of a solar cell.

The figures purely diagrammatically show a solar cell 10 as semiconductor component, intended to represent very generally a semiconductor component, showing, for example, a p-conducting silicon substrate 12, a rear contact 14, and an $n^{++}$ front area (emitter) 16 for the formation of an np-transition between the emitter 16 and the substrate 12. This is necessary in order to separate the charge carriers produced by incident electromagnetic radiation, and to be able to tap current or voltage via the rear contact 14 and a front contact 18. The structure of the front contact 18 is described in greater detail below in reference to FIGS. 1-5.

From the diagrammatic representation of the solar cell 10, one can see, moreover, that the emitter 16 is covered by a dielectric coating, such as, a passivation coating 20, which, in the case of a silicon substrate, can consist of $SiN_x$:H.

A fluid which contains metal atoms is applied on the passivation coating 20, which also functions as antireflection coating. This is explained below in reference to an Ag paste, without any intent to limit the teaching of the invention.

For the formation of the metal contacts 18, the Ag paste is applied in the form of strips 22, 24 on the passivation coating 20, and dried. The silver paste contains, among other components, metal particles, glass particles and/or metal oxides, solvents, organic binders, and additives. Then, a heat treatment is carried out, which, in the case of the production of metal contacts on solar cells, that is the front contacts, is also referred to as firing or sintering. With an appropriate heat treatment, a glass matrix or metal oxide matrix wets both the Ag particle structure and also the electrical passivation coating 20, and etches locally through this coating 20 (FIG. 2). During the cooling, Ag crystallites 26, 28 are then deposited in the emitter 16 (FIG. 3).

Figure 4:
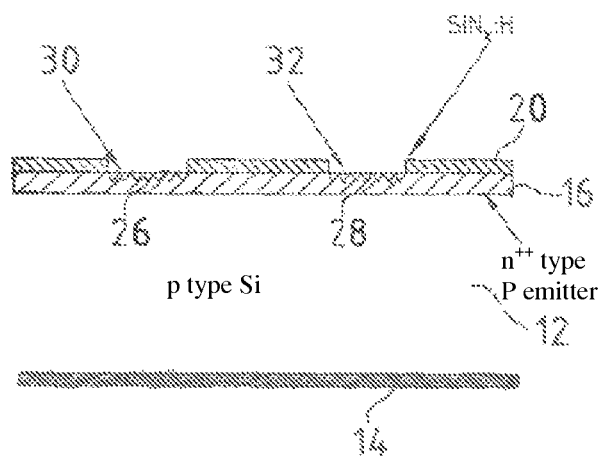
Figure 5:
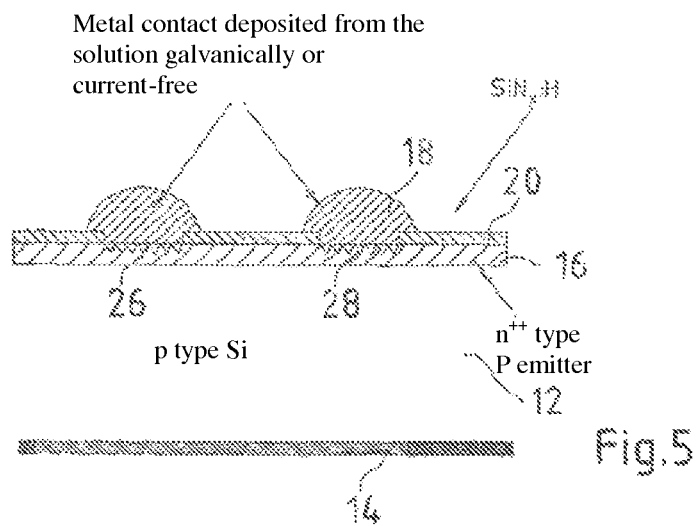

According to the invention, the originally applied metal structure, that is the components of the silver paste which are present after the firing or sintering, as well as the areas of the passivation coating 20 located beneath the silver paste, are then removed. This can occur by reducing or etching chemical treatment steps, which substantially completely remove the glass or metal oxide coatings formed during the firing or sintering on the emitter 16, as illustrated in FIG. 4. It is preferred that underetching of the glass or metal oxide coating occurs, so that this coating, together with the metal contact structure located on it, and the coating present on the substrate, are removed in the area of the glass or metal oxide coating. Only the crystallites 26, 28 which have grown into the emitter 16 remain, extending up to the surface of the emitter 16 (area 30, 32). Any oxide coatings present on the surface of the crystallites 26, 28 are removed. Then, metal is deposited onto the corresponding areas 30, 32 preferably galvanically or current-free, in order to form the metal contact or front contact 18 (FIG. 5). The deposited metal coatings must allow a good ohmic electrical conductivity with respect to the remaining metal contacts, that is the crystallites 26, 28, and thus connect the crystallites in the silicon to each other with electrical conductivity. No intermediate coating, as present according to the state of the art, is present between the crystallites 26, 28 and the front contact.

Preferred process parameters and materials for the formation of the metal front contacts 18 can be obtained from the following embodiment example.

The invention is explained additionally in further detail using the following example.

A preferred form of the application of the teaching according to the invention uses, for example, the application of a silver paste on the light receiving side of a solar cell, which side is provided with an $n^+$ emitter and above it a SiNx:H passivation coating. The silver paste is applied, as is usually done, in line-shaped equidistant arrangements. For this purpose, one can consider using, for example, screen printing methods, which apply Ag paste lines having a typical width of 40-140 μm at separations of 1-3 mm. Perpendicularly to these lines, elongate areas with silver pastes are usually also applied, which are considerably wider. These so-called "busbars" or collective contacts on the solar cell front side are typically 0.5-3 mm wide, and they are printed symmetrically with respect to the cell center, as two or three collective contacts. After the completion of the solar cells, these collective contacts are used to apply soldering connectors by soldering, so that the solar cells can be electrically connected to each other in solar modules.

The height of the printed Ag paste contacts can, in the method described here, be chosen to be considerably smaller than in conventional methods, in which screen printed contacts are used exclusively, because the intrinsic line conductivity of the contact is produced by the galvanic reinforcement of the contact lines. Instead of typical application heights of approximately 10-15 µm for screen printed contacts, application heights of 1-10 µm are thus entirely sufficient. After the Ag pastes have been applied and dried, and contacts have also been printed optionally on the rear side of the solar cells, the contacts are sintered in a high temperature firing step typically at 780-840° C., and fired through the silicon nitride passivation and antireflection coating into the silicon of the emitter area. In the process, the silicon nitride coating beneath the contacts is etched off, and parts of the emission area of the glass metal melt are reduced. During the cooling of the contacts, Ag deposits epitaxially out of the melt in the silicon. The glass metal melt subsequently solidifies, and it usually leaves metal precipitates in the glass layer, which separates the Ag crystallites that have deposited epitaxially and grown in the silicon from the contact structure of the originally applied Ag paste.

In a subsequent process step, it is preferred to continuously convey the so produced solar cells in a wet chemistry throughput process through a solution which reduces oxidic areas and glass layers of the metal contacts (for example, a buffered HF solution) on roller conveyance systems, for a previously established process time (typically on the order of one minute), which is sufficient to underetch the separating glass layer between metal structure and Ag crystallites. The solar cells in the process are processed preferably with the front side downward, to ensure that the metal structure of the original contact lines, due to the high density of Ag, becomes enriched at the bottom in the vat of the wet chemistry throughput installation, and can be removed in a controlled manner there.

After a subsequent washing step, the solar cells continue to be transported into a subsequent wet chemistry installation for light galvanic deposition of Ag, as available, for example, from the company Schmid in Freudenstadt. In this installation, Ag continues to be deposited onto the Ag crystallite areas that have grown into the silicon.

Since the metal deposition out of the aqueous solution occurs nearly isotropically, adjacent crystallite areas merge and reconstitute again an overall cohesive conductive contact along the originally applied contact lines. The conductivity of these contacts is clearly better than the screen printed Ag contacts, and it can be determined by the application height of the galvanic reinforcement. The Ag contact produced has a compact cross section without noteworthy porosity and thus nearly the same conductivity as Ag. The contact to silicon is clearly improved by the direct ohmic metal contact between Ag crystallites and deposited Ag, compared to the original contact transition resistance of the screen printed contacts. Under some circumstances, it can be advantageous to further improve the contact properties, in an additional treatment step under a forming gas atmosphere at approximately 250-450° C. for 10-90 min.

However, the method described here is in no way limited to this embodiment example or to front side contacts of solar cells.

The invention is also not limited to solar cells, rather it relates to all types of semiconductor components to which an electrically conductive contact is to be applied. Overall, the term "solar cell" is to be understood as synonymous.

Moreover, the scope of the teaching according to the invention includes the situation where a coating is located on the semiconductor substrate, because the other process steps themselves are inventive in this respect.

The invention claimed is:

1. Method for producing at least one electrically conducting metal contact, strip-shaped in particular, on a semiconductor component, such as, a solar cell, which presents, on the surface on a semiconductor coating, a coating, such as, a dielectric coating, such as, a passivation coating, comprising the process steps,
   line-, strip- and/or point-shaped application of a fluid to the coating, which contains at least particles made of metal, and particles made of glass frit,
   hardening of the fluid by heat treatment with simultaneous formation of:
      cohesive metal structure for sintering the metal particles together,
      a glass layer between the metal structure and the semiconductor substrate, and
      metal areas in the semiconductor substrate, which are deposited by the glass layer from the metal structure on the semiconductor substrate,
   removal of the separating glass layer by etching, and thus simultaneous removal of the metal structure, without removal of the metal areas which have grown into the semiconductor substrate,
   for the formation of the at least one electrically conductive contact, intermediate coating-free deposition of electrically conducting material from a solution onto the metal areas of the semiconductor component, which have grown into the semiconductor component, where, above the metal areas, the glass layer and metal structure coating have been removed, with simultaneous electrically conducting connection of the metal areas present in these areas in the substrate.

2. Method according to claim 1, characterized in that, the metal areas were produced by the formation of crystallites from the metal and/or metal atoms.

3. Method according to claim 1, characterized in that, as fluid, a fluid is used which contains additionally metal oxide and/or the surface of the metal particles is coated and/or oxidized.

4. Method according to claim 1, characterized in that, as fluid, a paste, an ink and/or an aerosol is/are used.

5. Method according to claim 1, characterized in that, as coating, in particular dielectric coating, a coating is applied to the solar cell which consists of and/or contains at least one material selected from the group consisting of $SiN_x:H$, $SiO_2$, $TiO_x$, $Al_2O_3$, $SiNO_x$, and SiC.

6. Method according to claim 1, characterized in that the fluid, such as, the paste, is applied on the surface by printing methods, such as, screen printing, offset printing, pad printing and/or transfer printing, by dispensing methods, ink jet methods, aerosol jet methods, powder coating methods.

7. Method according to claim 1, characterized in that the fluid is applied in the shape of a strip, net or star.

8. Method according to claim 1, characterized in that the fluid is applied in the shape of a point, particularly points arranged in rows.

9. Method according to claim 1, characterized in that, as fluid, a fluid is used which contains at least one oxide selected from the group consisting of Pd, Cd, Zn, Bi, Sn, Sb, Al, P, B, Ti, Pd, Tl, Zr, Li, Ga, Ni and Si.

10. Method according to claim 1, characterized in that, as metal particles, metal particles are used which contain at least one metal selected from the group consisting of Ag, Ni, Cu, Pb, Ti, Sn, Al, and one or more alloys.

11. Method according claim 1, characterized in that the dried fluid is removed by etching, such as, by wet or dry chemistry etching processes or plasma etching processes.

12. Method according claim 1, characterized in that, the electrically conducting material is applied to the surface of the semiconductor components by galvanic or current-free metal deposition methods.

13. Method according to claim 1, characterized in that, instead of deposition of the electrically conducting material out of the solution, the electrically conducting material is applied by soldering methods, such as, ultrasonic soldering methods or heat soldering or by firing methods, such as, flame spraying.

14. Method according to claim 1, characterized in that, as electrically conducting material, a metal paste is used.

15. Method according to claim 1, characterized in that the galvanic deposition of the electrically conducting material is influenced by light induction.

16. Method according to claim 1, characterized in that the electrically conducting material is applied with the width B with B <100 µm, particularly B <60 µm, preferably B <40 µm, particularly preferably B <20 µm.

17. Method according to claim 1, characterized in that the electrically conducting material is applied with an application height with H <15 µm, particularly H <10 µm, preferably H <5 µm, particularly preferably H <1 µm.

18. Method according to claim 1, characterized in that a semiconductor substrate is used, which presents in its areas to be contacted with the electrically conducting material a dopant concentration C with $C < 10^{20}$ atoms/cm$^3$, preferably with $C < 5 \cdot 10^{19}$, atoms/cm$^3$, particularly $C \sim 10^{19}$ atoms/cm$_3$.

* * * * *